United States Patent
Hsu et al.

(10) Patent No.: US 11,799,473 B1
(45) Date of Patent: Oct. 24, 2023

(54) CLOSED-LOOP INDUCTOR CURRENT EMULATING CIRCUIT

(71) Applicant: ANPEC ELECTRONICS CORPORATION, Hsinchu (TW)

(72) Inventors: Chun-Kai Hsu, Hsinchu (TW); Chih-Heng Su, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 17/990,811

(22) Filed: Nov. 21, 2022

(30) Foreign Application Priority Data

Sep. 19, 2022 (TW) .................................. 111135264

(51) Int. Cl.
*H03K 17/56* (2006.01)
*H03K 5/24* (2006.01)

(52) U.S. Cl.
CPC ............... *H03K 17/56* (2013.01); *H03K 5/24* (2013.01); *H03K 2217/0063* (2013.01); *H03K 2217/0072* (2013.01)

(58) Field of Classification Search
CPC .... H02M 3/155; H02M 3/1582; H02M 3/158; H02M 1/0009; H02M 1/0019; H02M 1/0058; H03K 3/0231; H03K 4/00; H03F 3/45475; H03F 2203/45138
See application file for complete search history.

(56) References Cited

U.S. PATENT DOCUMENTS

2021/0099080 A1* 4/2021 Chen ...................... H02M 3/155
2023/0031749 A1* 2/2023 Chakraborty .......... H03K 3/037

* cited by examiner

*Primary Examiner* — Quan Tra
(74) *Attorney, Agent, or Firm* — Li & Cai Intellectual Property (USA) Office

(57) ABSTRACT

A closed-loop inductor current emulating circuit is provided. An emulation controller circuit generates an emulating signal according to a current flowing through a first terminal of a low-side switch of a power converter. When the emulation controller circuit outputs the emulating signal to a charging and discharging circuit, the charging and discharging circuit outputs a charging and discharging signal to a first terminal of a capacitor according to the emulating signal. When the emulation controller circuit outputs the emulating signal to a control terminal of the capacitor to adjust a capacitance of the capacitor, the charging and discharging circuit outputs a charging and discharging signal to the first terminal of the capacitor according to one or both of an input voltage and an output voltage of the power converter.

20 Claims, 12 Drawing Sheets

CLOSED-LOOP INDUCTOR CURRENT EMULATING CIRCUIT

CROSS-REFERENCE TO RELATED PATENT APPLICATION

This application claims the benefit of priority to Taiwan Patent Application No. 111135264, filed on Sep. 19, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power converter, and more particularly to a closed-loop inductor current emulating circuit that is applicable to a power converter.

BACKGROUND OF THE DISCLOSURE

Power converters are indispensable devices for electronic devices. The power converters are used to adjust power and supply the adjusted power to the electronic devices. If an output terminal of the power converter intents to supply power suitable for the electronic device connected thereto, high-side switches and low-side switches of the power converter must be switched according to voltages, currents or other data of circuit components of the power converter. However, a conventional detector circuit is not able to precisely and instantly detect an inductor current of the power converter and thus the detected inductor current needs to be further corrected.

SUMMARY OF THE DISCLOSURE

In response to the above-referenced technical inadequacies, the present disclosure provides a closed-loop inductor current emulating circuit. The closed-loop inductor current emulating circuit is applicable to a power converter. The power converter includes a driver circuit, a high-side switch, a low-side switch, an inductor and an output capacitor. An output terminal of the driver circuit is connected to a control terminal of the high-side switch and a control terminal of the low-side switch. A first terminal of the high-side switch is coupled to an input voltage. A second terminal of the high-side switch is connected to a first terminal of the low-side switch. A second terminal of the low-side switch is grounded. A node between the second terminal of the high-side switch and the first terminal of the low-side switch is connected to a first terminal of the inductor. A second terminal of the inductor is connected to a first terminal of the output capacitor. A second terminal of the output capacitor is grounded. The closed-loop inductor current emulating circuit includes a current sensor circuit, an emulation controller circuit, a feedback circuit and a charging and discharging circuit. The current sensor circuit is connected to the first terminal of the low-side switch. The current sensor circuit is configured to sense a current flowing through the first terminal of the low-side switch to output a current sensed signal. The emulation controller circuit is connected to the current sensor circuit. The emulation controller circuit is configured to determine a plurality of voltages of a plurality of waveforms of an emulating signal according to a plurality of currents of the current sensed signal. The emulation controller circuit is configured to output the emulating signal. The feedback circuit is connected to a first terminal of a capacitor and the emulation controller circuit. A second terminal of the capacitor is grounded. The feedback circuit is configured to output a feedback signal to the emulation controller circuit according to a voltage signal or a current signal of the capacitor. The emulation controller circuit is configured to compensate the emulating signal according to the feedback signal. The emulation controller circuit is configured to output the emulating signal that is compensated. The charging and discharging circuit is connected to the first terminal of the capacitor. When the emulation controller circuit outputs the emulating signal to the charging and discharging circuit being connected to the emulation controller circuit, the charging and discharging circuit outputs a charging and discharging current to the first terminal of the capacitor according to the emulating signal. When the emulation controller circuit outputs the emulating signal to a control terminal of the capacitor being connected to the emulation controller circuit to adjust a capacitance of the capacitor, the charging and discharging circuit outputs the charging and discharging current to the first terminal of the capacitor according to the input voltage, a voltage of a node between the second terminal of the inductor and the first terminal of the output capacitor or a combination thereof.

In certain embodiments, the feedback circuit obtains the voltage signal of the capacitor and then converts the voltage signal of the capacitor into the current signal as the feedback signal.

In certain embodiments, the emulation controller circuit includes a sample and hold circuit. The sample and hold circuit is configured to sample and hold the plurality of currents on a plurality of waveform segments of a plurality of waveforms of the current sensed signal and the feedback signal.

In certain embodiments, the plurality of currents being sampled and held by the sample and hold circuit include valley currents on one or more of the plurality of waveforms of one or both of the current sensed signal and the feedback signal.

In certain embodiments, the plurality of currents being sampled and held by the sample and hold circuit include currents of one or both of the current sensed signal and the feedback signal that are generated when a current time reaches half of an on-time of the low-side switch.

In certain embodiments, the emulation controller circuit further includes an arithmetic circuit. The arithmetic circuit is connected to the sample and hold circuit. The arithmetic circuit calculates a current difference between the plurality of currents at different time points on each of the plurality of waveform segments of the current sensed signal. The arithmetic circuit calculates a current difference between the plurality of currents at different time points on each of the plurality of waveform segments of the feedback signal.

In certain embodiments, the emulation controller circuit further includes a first resistor and a second resistor. A first terminal of the first resistor and a first terminal of the second resistor are connected to the arithmetic circuit and the charging and discharging circuit. A second terminal of the first resistor and a second terminal of the second resistor are grounded. The arithmetic circuit provides the current difference between the plurality of currents on each of the plurality of waveform segments of the current sensed signal to the first resistor. The arithmetic circuit provides the current difference between the plurality of currents on each of the plurality of waveform segments of the feedback signal to the second resistor. A voltage of the emulating signal depends on a voltage of the first resistor, a voltage of the second resistor or a combination thereof.

In certain embodiments, the emulation controller circuit further includes a comparing circuit. The comparing circuit is connected to the first terminal of the first resistor and the first terminal of the second resistor. The comparing circuit is configured to compare a voltage of the first terminal of the first resistor with a voltage of the first terminal of the second resistor to output a comparing signal. The voltage of the emulating signal depends on the comparing signal.

In certain embodiments, the emulation controller circuit further includes a counter. The counter is connected to the comparing circuit. The counter is configured to count the comparing signal to output the emulating signal.

In certain embodiments, the emulation controller circuit further includes a third resistor. A first terminal of the third resistor is connected to the sample and hold circuit. A second terminal of the third resistor is grounded. The third resistor receives an initial current of each of the plurality of waveforms of the current sensed signal that is sampled and held by the sample and hold circuit. A voltage of the third resistor is provided to the capacitor.

In certain embodiments, the closed-loop inductor current emulating circuit further includes an initial control circuit. The initial control circuit is connected to the emulation controller circuit and the first terminal of the capacitor. The emulation controller circuit outputs an initial signal according to a valley current of the sensed current signal or a voltage of the third resistor being charged by the initial current. The initial control circuit outputs the initial current to the capacitor to pull down a voltage of the voltage signal of the capacitor to a valley voltage according to the initial signal.

In certain embodiments, the initial control circuit includes a switch component. A first terminal of the switch component is connected to the emulation controller circuit. A second terminal of the switch component is connected to the first terminal of the capacitor. A control terminal of the switch component is coupled to a valley time pulse signal. The switch component is turned on or off according to a level of the valley time pulse signal.

In certain embodiments, the charging and discharging circuit includes a first comparator, a first charging resistor and a first transistor. A first input terminal of the first comparator is connected to the node between the second terminal of the inductor and the first terminal of the output capacitor. A second input terminal of the first comparator is connected to a first terminal of the first charging resistor. A second terminal of the first charging resistor is grounded. An output terminal of the first comparator is connected to a control terminal of the first transistor. A first terminal of the first transistor is coupled to a common voltage. A second terminal of the first transistor is connected to the first terminal of the first charging resistor. The first terminal of the capacitor is connected to the first terminal of the first transistor.

In certain embodiments, the emulation controller circuit is connected to a control terminal of the first charging resistor. The emulation controller circuit outputs the emulating signal to the control terminal of the first charging resistor to adjust a resistance of the first charging resistor.

In certain embodiments, the charging and discharging circuit further includes a second transistor. A control terminal of the second transistor is connected to the output terminal of the first comparator. A first terminal of the second transistor is coupled to the common voltage. A second terminal of the second transistor is connected to the first terminal of the capacitor.

In certain embodiments, the charging and discharging circuit further includes a third transistor and a fourth transistor. A first terminal and a control terminal of the third transistor are connected to the second terminal of the second transistor and a control terminal of the fourth transistor. A first terminal of the fourth transistor is connected to the first terminal of the capacitor. A second terminal of the third transistor and a second terminal of the fourth transistor are grounded.

In certain embodiments, the charging and discharging circuit further includes a second comparator, a second charging resistor and a fifth transistor. A first input terminal of the second comparator is coupled to the input voltage. A second input terminal of the second comparator is connected to a first terminal of the second charging resistor. A second terminal of the second charging resistor is grounded. The output terminal of the first comparator is connected to a control terminal of the fifth transistor. A first terminal of the fifth transistor is coupled to the common voltage. A second terminal of the fifth transistor is connected to the first terminal of the second charging resistor. The first terminal of the capacitor is connected to the first terminal of the fifth transistor.

In certain embodiments, the emulation controller circuit is connected to a control terminal of the second charging resistor. The emulation controller circuit outputs the emulating signal to the control terminal of the second charging resistor to adjust a resistance of the second charging resistor.

In certain embodiments, the charging and discharging circuit further includes a sixth transistor. A control terminal of the sixth transistor is connected to an output terminal of the second comparator. A first terminal of the sixth transistor is coupled to the common voltage. A second terminal of the sixth transistor is connected to the first terminal of the capacitor.

In certain embodiments, the charging and discharging circuit further includes a switch component. A first terminal of the switch component is connected to the second terminal of the sixth transistor. A second terminal of the switch component is connected to the first terminal of the capacitor. A control terminal of the switch component is connected to the driver circuit. The control terminal of the switch component receives a high-side conduction signal for controlling the high-side switch to operate from the driver circuit. The high-side switch and the switch component are turned on during an on-time of the high-side conduction signal.

As described above, the present disclosure provides the closed-loop inductor current emulating circuit. The configurations of the closed-loop inductor current emulating circuit are different from that of a conventional inductor current emulating circuit. The closed-loop inductor current emulating circuit of the present disclosure detects the currents of the rising waveform segments and the falling waveform segments of the plurality of waveforms of the current sensed signal of the low-side switch of the power converter. The closed-loop inductor current emulating circuit of the present disclosure is able to accurately and quickly emulate complete information of the inductor current according to the detected currents.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
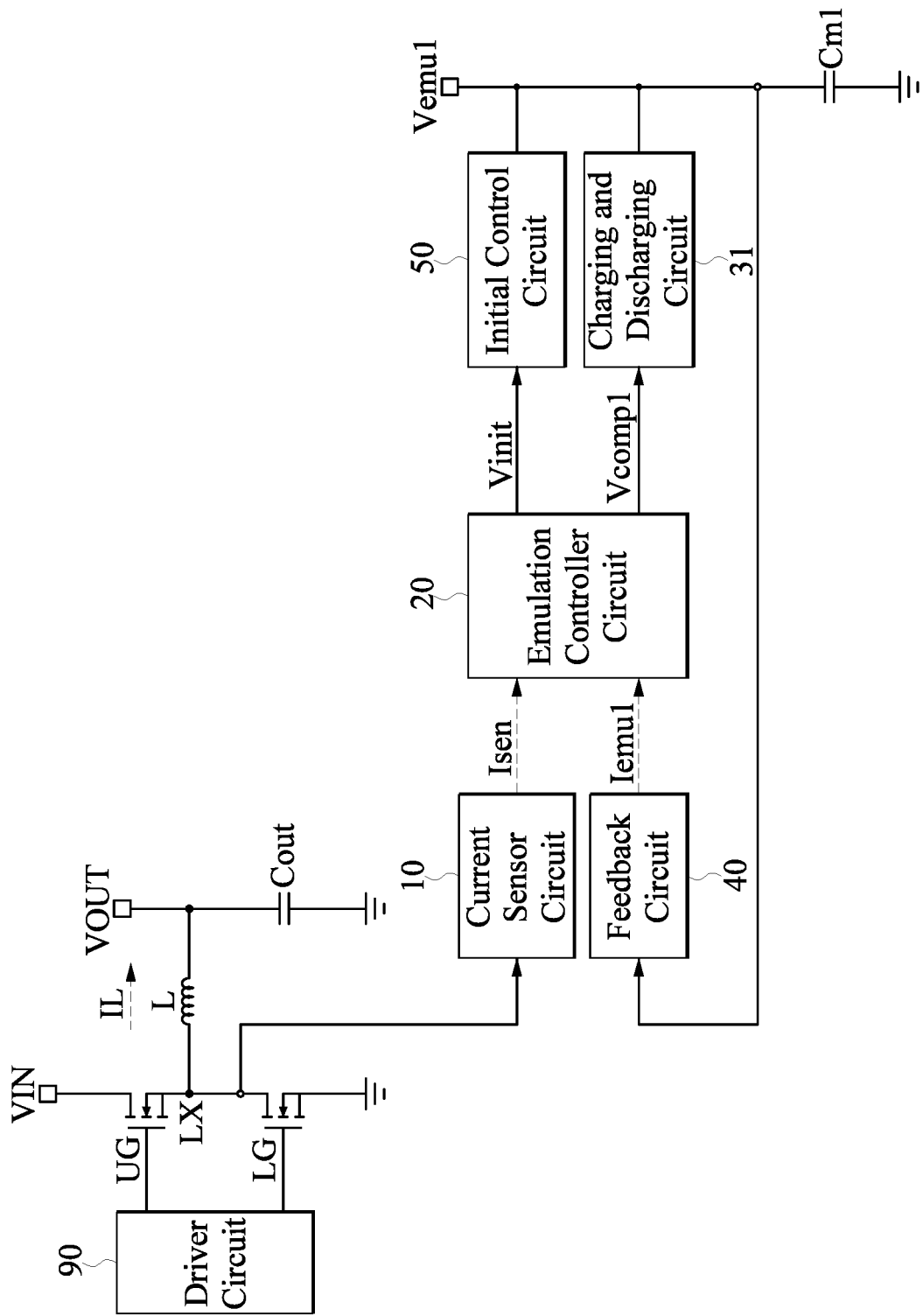
FIG. 1 is a circuit diagram of a closed-loop inductor current emulating circuit according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 9:
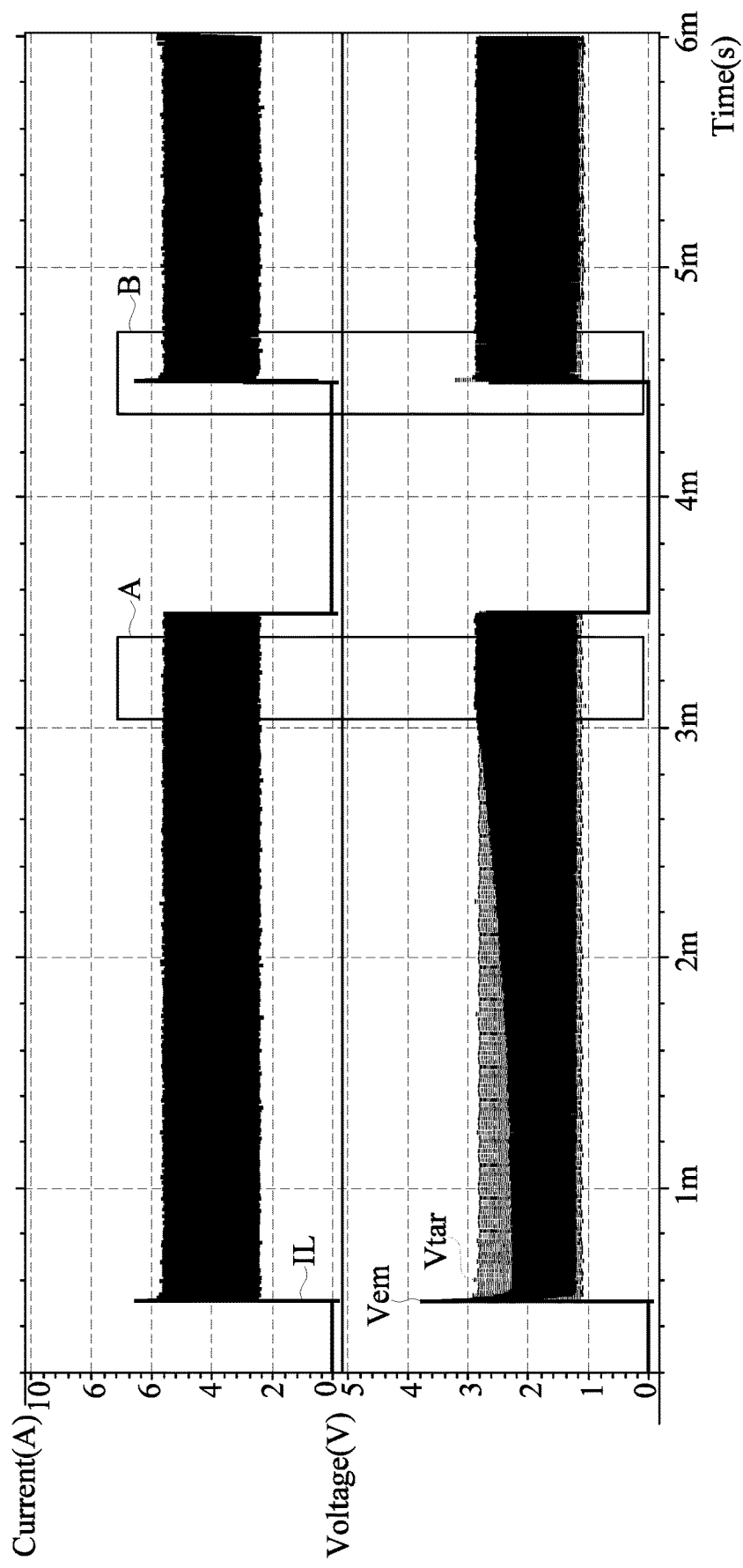
FIG. 9 is a waveform diagram of signals of the closed-loop inductor current emulating circuit according to the first to eighth embodiments of the present disclosure.
Figure 10A:
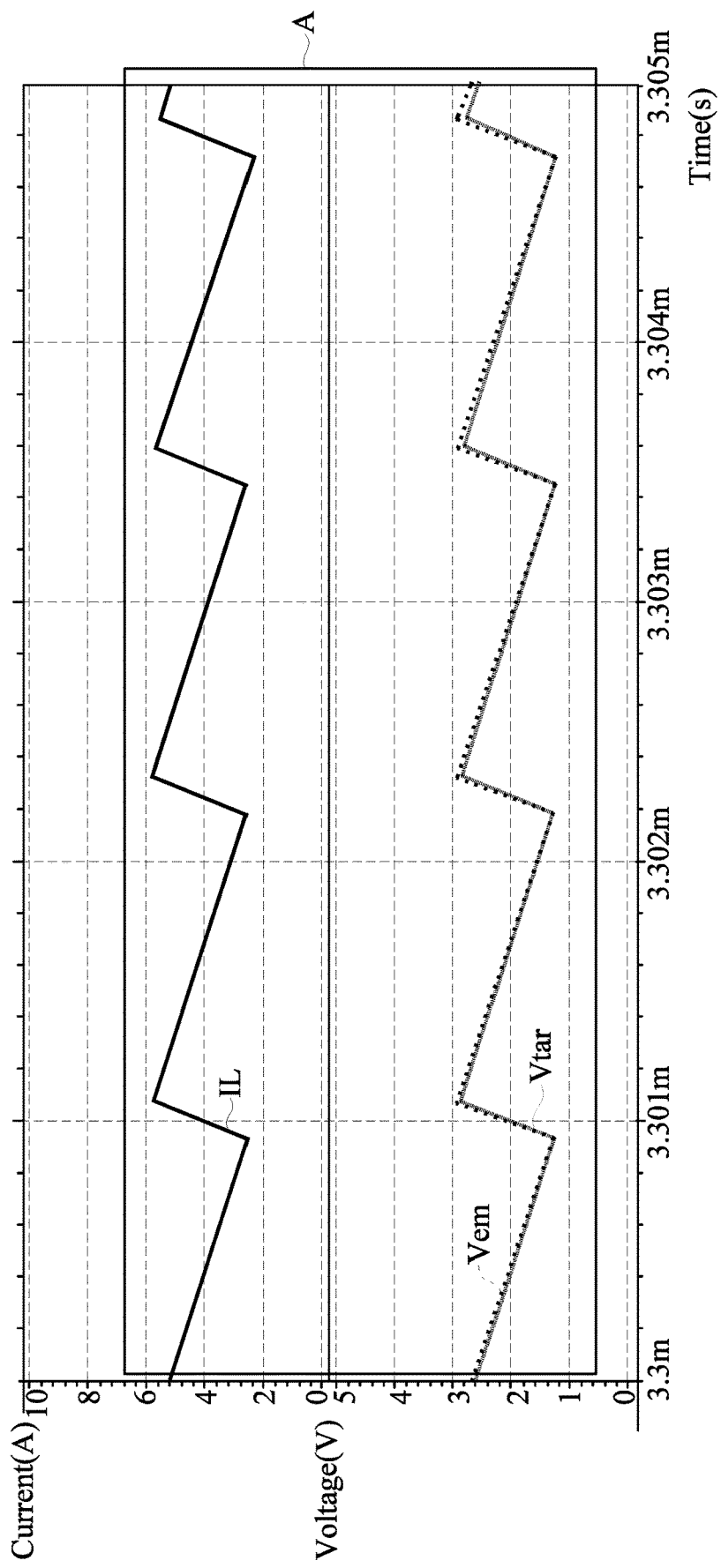
FIG. 10A is a waveform diagram of the signals of the closed-loop inductor current emulating circuit according to the first to eighth embodiments of the present disclosure.
Figure 11:
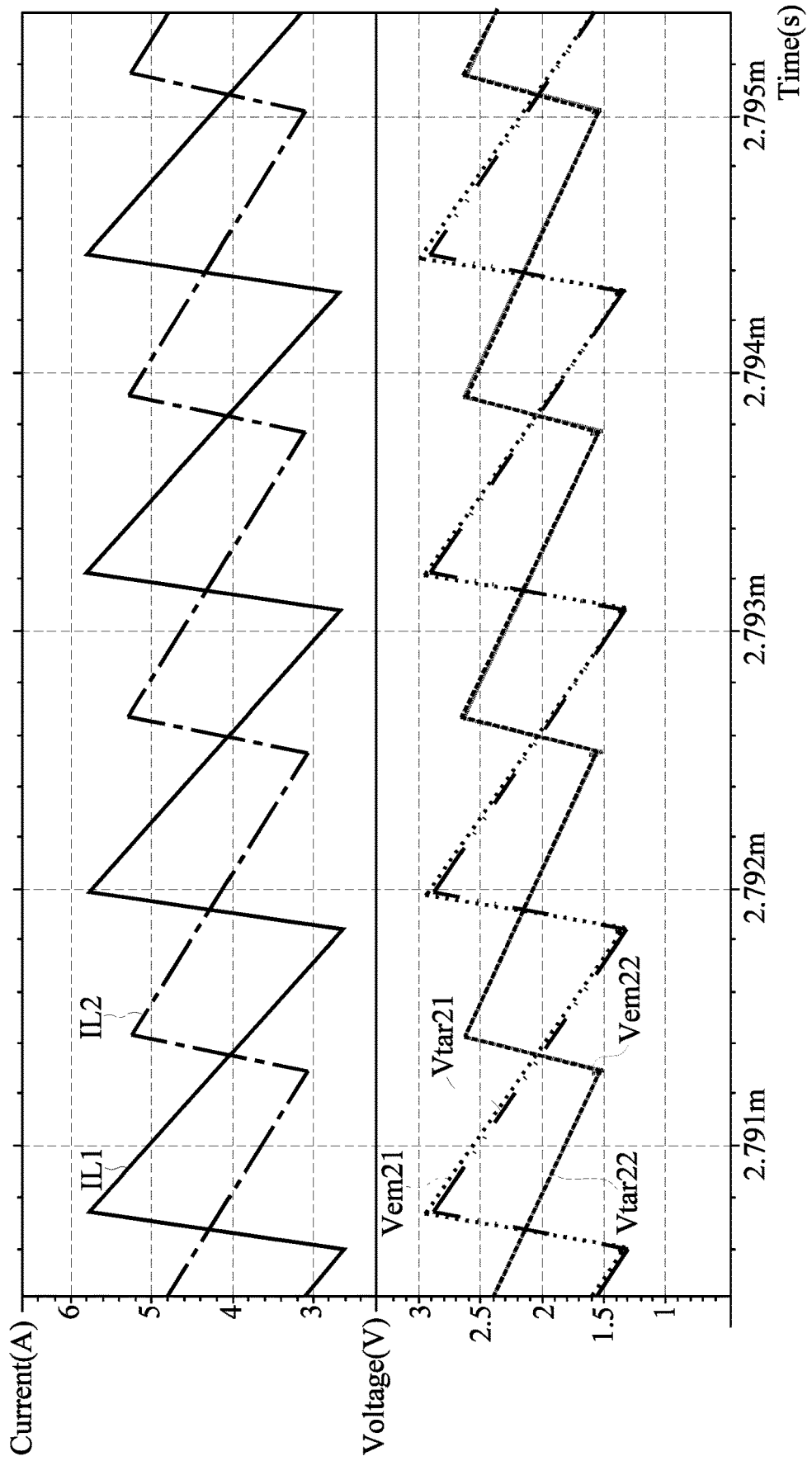
FIG. 11 is a waveform diagram of signals of the closed-loop inductor current emulating circuit of the first to eighth embodiments of the present disclosure.

Reference is made to FIG. 1, FIG. 9, FIG. 10A and FIG. 11, in which FIG. 1 is a circuit diagram of a closed-loop inductor current emulating circuit according to a first embodiment of the present disclosure, and FIG. 9, FIG. 10A and FIG. 11 are waveform diagrams of signals of the closed-loop inductor current emulating circuit according to the first to eighth embodiments of the present disclosure.

The closed-loop inductor current emulating circuit of the embodiment of the present disclosure is applicable to emulate an inductor current IL of an inductor L of a power converter as shown in FIG. 1 to generate an emulated voltage signal Vemu1.

The power converter includes a driver circuit 10, a high-side switch UG, a low-side switch LG, the inductor L and an output capacitor Cout. An output terminal of the driver circuit 10 is connected to a control terminal of the high-side switch UG and a control terminal of the low-side switch LG. A first terminal of the high-side switch UG is coupled to an input voltage VIN. A second terminal of the high-side switch UG is connected to a first terminal of the low-side switch LG. A second terminal of the low-side switch LG is grounded.

A node between the second terminal of the high-side switch UG and the first terminal of the low-side switch LG is connected to a first terminal of the inductor L. A second terminal of the inductor L is connected to a first terminal of the output capacitor Cout. A second terminal of the output capacitor Cout3 is grounded. A node between the second terminal of the inductor L and the first terminal of the output capacitor Cout is an output terminal of the power converter. A voltage of the output terminal of the power converter is an output voltage VOUT.

It is worth noting that, the closed-loop inductor current emulating circuit of the embodiment of the present disclosure may include a current sensor circuit 10, an emulation controller circuit 20, a charging and discharging circuit 31 and a feedback circuit 40. If necessary, the closed-loop inductor current emulating circuit of the embodiment of the present disclosure may further include an initial control circuit 50.

An input terminal of the current sensor circuit 10 is connected to the first terminal of the low-side switch LG. An output terminal of the current sensor circuit 10 is connected to an input terminal of the emulation controller circuit 20. An output terminal of the emulation controller circuit 20 is connected to an input terminal of the initial control circuit 50. An output terminal of the initial control circuit 50 is connected to a first terminal of a capacitor Cm1. A second terminal of the capacitor Cm1 is grounded.

An output terminal of the charging and discharging circuit 31 is connected to the first terminal of the capacitor Cm1. An input terminal of the feedback circuit 40 is connected to the first terminal of the capacitor Cm1. An output terminal of the feedback circuit 40 is connected to the input terminal of the emulation controller circuit 20. The output terminal of the emulation controller circuit 20 is connected to an input terminal of the charging and discharging circuit 31.

First, the current sensor circuit 10 senses a current flowing through the first terminal of the low-side switch LG to output a current sensed signal Isen. The emulation controller circuit 20, according to a plurality of currents of a plurality of waveforms of the current sensed signal Isen from the current sensor circuit 10, determines a plurality of voltages of a plurality of waveforms of an emulating signal Vcomp1. The emulation controller circuit 20 outputs the emulating signal Vcomp1 to the charging and discharging circuit 31. The charging and discharging circuit 31, according to the emulating signal Vcomp1 from the emulation controller circuit 20, outputs a charging and discharging current to the capacitor Cm1 to charge and discharge the capacitor Cm1.

Further, the feedback circuit 40 outputs a feedback signal Iemu1 to the emulation controller circuit 20 according to a voltage signal or a current signal of the capacitor Cm1. For example, the feedback circuit 40 obtains the voltage signal of the capacitor Cm1 and converts the voltage signal of the capacitor Cm1 into the current signal, and then outputs the current signal to the emulation controller circuit 20, but the present disclosure is not limited thereto.

When the emulation controller circuit 20 receives the feedback signal Iemu1 from the feedback circuit 40, the emulation controller circuit 20 compensates the emulating signal Vcomp1 according to the feedback signal Iemu1 (that is the voltage signal or the current signal of the capacitor Cm1). Then, the emulation controller circuit 20 outputs the emulating signal that is compensated to the charging and discharging circuit 31. The charging and discharging circuit 31, according to the emulating signal that is compensated, outputs the charging and discharging current that is emulated to the capacitor Cm1 to charge and discharge the capacitor Cm1.

In other words, the emulation controller circuit 20 may output the emulating signal Vcomp1 to the charging and discharging circuit 31, according to the current sensed signal Isen from the current sensor circuit 10, the feedback signal Iemu1 from the feedback circuit 40 or a combination thereof. Then, the charging and discharging circuit 31 charges and discharges the capacitor Cm1 according to the emulating signal Vcomp1 from the emulation controller circuit 20.

Finally, by using the closed-loop inductor current emulating circuit of the present disclosure to emulate the inductor current IL, voltages of the voltage signal of the capacitor Cm1 being charged and discharged (to the feedback circuit 40) form a plurality of (rising and falling) waveform segments of the emulated voltage signal Vemu1.

Figure 10B:
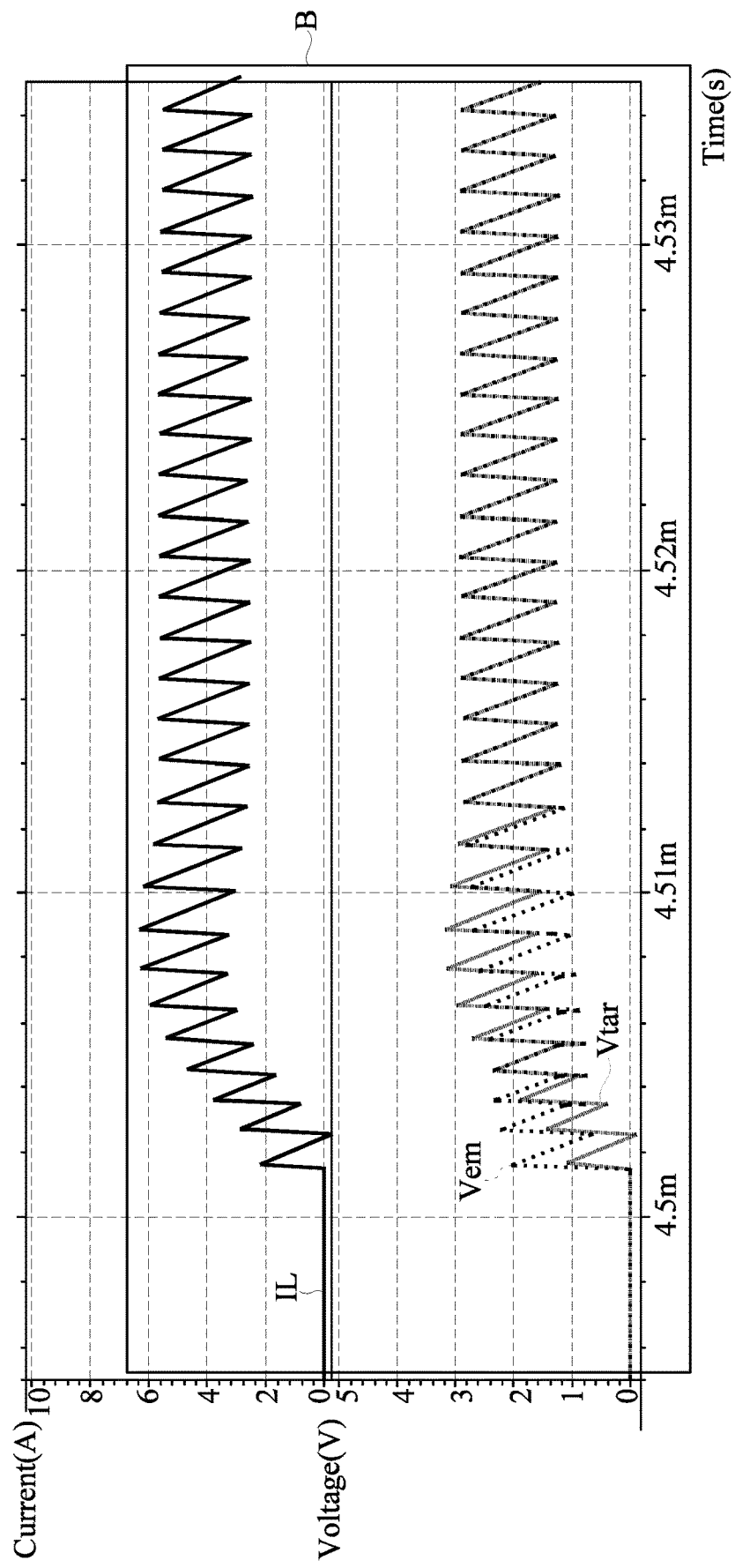
FIG. 10B is a waveform diagram of the signals of the closed-loop inductor current emulating circuit according to the first to eighth embodiments of the present disclosure.

As shown in FIGS. 9, 10A and 10B, a voltage of a preset voltage signal Vtar is half of the inductor current IL. The closed-loop inductor current emulating circuit of the present disclosure may emulate the inductor current IL to generate an emulated voltage signal Vem that is substantially overlapped with the preset voltage signal Vtar as shown in FIGS. 9, 10A and 10B.

For example, if an inductance of the inductor L is 0.47 uH, the current of the inductor L is an inductor current IL1 as shown in FIG. 11. If the inductance of the inductor L is 0.68 uH, the current of the inductor L is an inductor current IL2 as shown in FIG. 11. The closed-loop inductor current emulating circuit of the present disclosure emulates the inductor current IL1 to generate an emulated voltage signal Vem21 that is substantially overlapped with a preset voltage signal Vtar21. The closed-loop inductor current emulating circuit of the present disclosure emulates the inductor current IL2 to generate an emulated voltage signal Vem22 that is substantially overlapped with a preset voltage signal Vtar22. It is apparent that, regardless of the inductance of the inductor L, the closed-loop inductor current emulating circuit of the present disclosure is able to accurately emulate information of the inductor current.

Each time when the charging and discharging circuit 31 provides the charging and discharging current to the capacitor Cm1 according to the emulating signal Vcomp1 to discharge the voltage signal of the capacitor Cm1 to reach a time point of a valley value of the inductor current IL, the initial control circuit 50 may output an initial current to the capacitor Cm1 according to the initial signal Vinit from the emulation controller circuit 20. As a result, a voltage of the voltage signal of the capacitor Cm1 is directly pulled down to a valley voltage by the initial current. Under this condition, the closed-loop inductor current emulating circuit of the embodiment of the present disclosure more smoothly emulates the inductor current IL of the power converter to generate the emulated voltage signal Vemu1.

Figure 2:
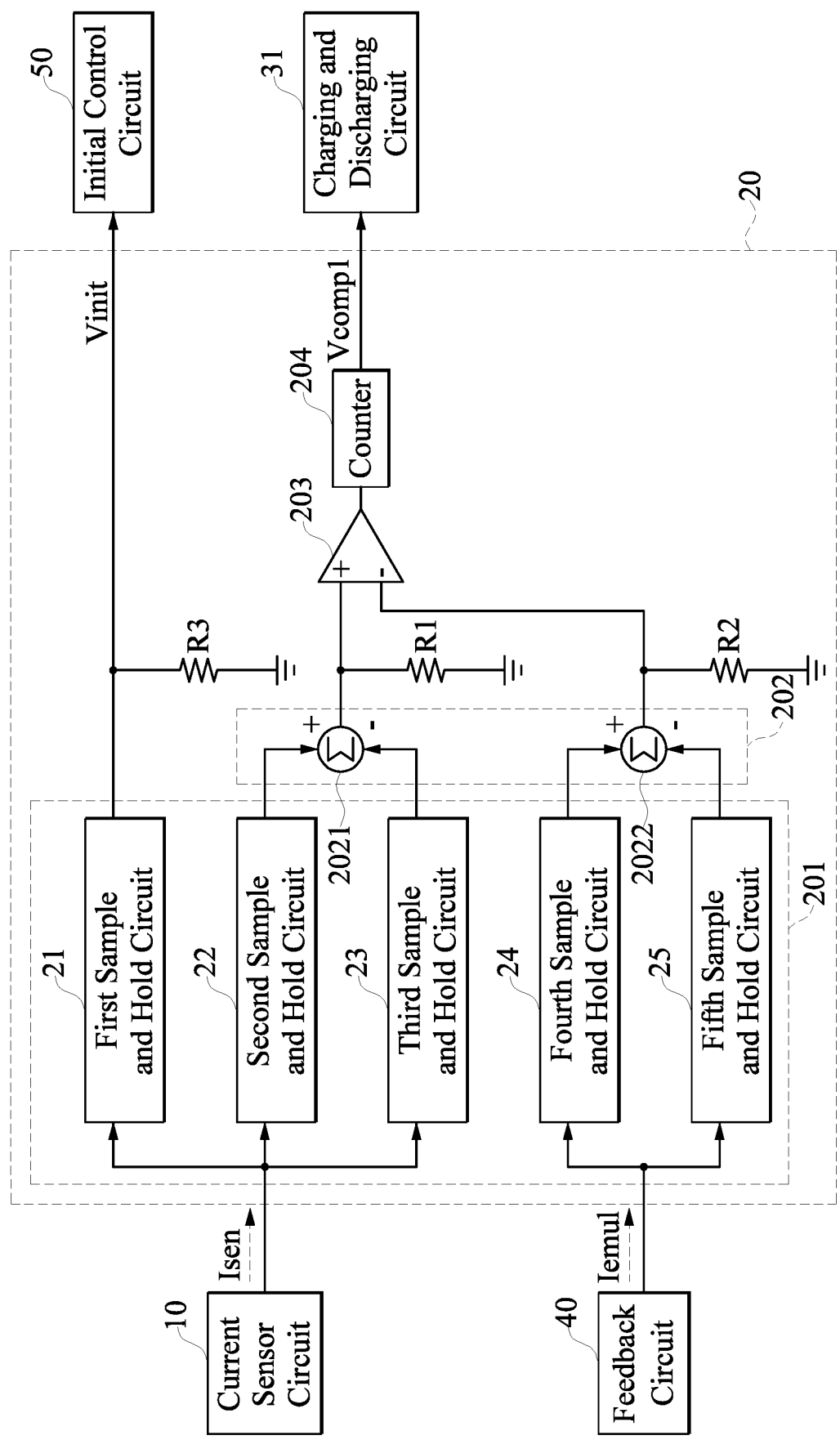
FIG. 2 is a circuit diagram of an emulation controller circuit of a closed-loop inductor current emulating circuit according to a second embodiment of the present disclosure.

Reference is made to FIG. 2, which is a circuit diagram of an emulation controller circuit of a closed-loop inductor current emulating circuit according to a second embodiment of the present disclosure.

The closed-loop inductor current emulating circuit of the embodiment of the present disclosure may include the emulation controller circuit 20 as shown in FIG. 2. The emulation controller circuit 20 shown in FIG. 1 may be the same as that shown in FIG. 2, but the present disclosure is not limited thereto.

As shown in FIG. 2, the emulation controller circuit 20 may include one or more of: a sample and hold circuit 201, an arithmetic circuit 202, a comparing circuit (including a comparator 203), a counter 204, a first resistor R1, a second resistor R2 and a third resistor R3.

The output terminal of the current sensor circuit 10 and the output terminal of the feedback circuit 40 are connected to an input terminal of the sample and hold circuit 201 of the emulation controller circuit 20.

An output terminal of the sample and hold circuit 201 is connected to an input terminal of the arithmetic circuit 202, the input terminal of the initial control circuit 50 and a first terminal of the third resistor R3. A second terminal of the third resistor R3 is grounded. An output terminal of the arithmetic circuit 202 is connected to a first input terminal of the comparator 203, a second input terminal of the comparator 203, a first terminal of the first resistor R1 and a first terminal of the second resistor R2. A second terminal of the first resistor R1 and a second terminal of the second resistor R2.

An output terminal of the comparator 203 of the comparing circuit is connected to an input terminal of the counter 204. An output terminal of the counter 204 is connected to the input terminal of the charging and discharging circuit 31. As shown in FIG. 1, the output terminal of the charging and discharging circuit 31 and the output terminal of the initial control circuit 50 are connected to the first terminal of the capacitor Cm1.

The sample and hold circuit 201 may be a single circuit. Alternatively, the sample and hold circuit 201 may include a plurality of sample and hold circuits such as, but not limited to a first sample and hold circuit 21, a second sample and hold circuit 22, a third sample and hold circuit 23, and a fourth sample and hold circuit 24 and a fifth sample and hold circuit 25 as shown in FIG. 2.

The arithmetic circuit 202 may be a single circuit. Alternatively, the arithmetic circuit 202 may include a plurality of arithmetic operators such as, but not limited to a first arithmetic operator 2021 and a second arithmetic operator 2022 as shown in FIG. 2.

As shown FIG. 2, an input terminal of the first sample and hold circuit 21, an input terminal of the second sample and hold circuit 22 and an input terminal of the third sample and hold circuit 23 are connected to the output terminal of the current sensor circuit 10. An output terminal of the first sample and hold circuit 21 may be connected to the input terminal of the initial control circuit 50 and the first terminal of the third resistor R3.

An output terminal of the second sample and hold circuit 22 and an output terminal of the third sample and hold circuit 23 may be connected to an input terminal of the first arithmetic operator 2021. An output terminal of the first arithmetic operator 2021 may be connected to the first input terminal of the comparator 203 and the first terminal of the first resistor R1.

An input terminal of the fourth sample and hold circuit 24 and an input terminal of the fifth sample and hold circuit 25 may be connected to the output terminal of the feedback circuit 40. An output terminal of the fourth sample and hold circuit 24 and an output terminal of the fifth sample and hold circuit 25 may be connected to an input terminal of the second arithmetic operator 2022. An output terminal of the second arithmetic operator 2022 may be connected to the second input terminal of the comparator 203 of the comparing circuit and the first terminal of the second resistor R2.

First, the second sample and hold circuit 22 may sample and hold one of the plurality of currents on each of a plurality of waveform segments (including a plurality rising waveform segments and a plurality falling waveform segments) of the plurality of waveforms of the current sensed signal Isen. For example, the one of the plurality of currents of the current sensed signal Isen may be generated when the current time reaches half of an on-time of the low-side switch LG shown in FIG. 1, but the present disclosure is not limited thereto.

The third sample and hold circuit 23 may sample and hold another of the plurality of currents on each of the plurality of waveform segments (including the plurality rising waveform segments and the plurality falling waveform segments) of the plurality of waveforms of the current sensed signal Isen. For example, the another of the plurality of currents of the current sensed signal Isen may be a valley current of the current sensed signal Isen, but the present disclosure is not limited thereto.

Then, the first arithmetic operator 2021 may calculate a current difference between the one of the plurality of currents being held by the second sample and hold circuit 22 and the another of the plurality of currents being held by the third sample and hold circuit 23 to output a first current signal to the first input terminal of the comparator 203 or the first terminal of the first resistor R1.

The fourth sample and hold circuit 24 may sample and hold one of a plurality of currents or voltages on each of a plurality of waveform segments (including a plurality rising waveform segments and a plurality falling waveform segments) of a plurality of waveforms of the feedback signal Iemu1 (that is the voltage signal or the current signal of the capacitor Cm1). For example, the one of the plurality of currents or voltages of the feedback signal Iemu1 may be generated when the current time reaches half of the on-time of the low-side switch LG shown in FIG. 1, but the present disclosure is not limited thereto.

The fifth sample and hold circuit 25 may sample and hold another of the plurality of currents or voltages on each of the plurality of waveform segments (including the plurality rising waveform segments and the plurality falling waveform segments) of the plurality of waveforms of the feedback signal Iemu1. For example, the another of the plurality of currents or voltages of the feedback signal Iemu1 may be a valley current or a valley voltage of the feedback signal Iemu1, but the present disclosure is not limited thereto.

The second arithmetic operator 2022 may calculate a difference between the one of the plurality of currents or voltages being held by the fourth sample and hold circuit 24 and the another of the plurality of currents or voltages being held by the fifth sample and hold circuit 25 to output a second current signal or a second voltage signal to the second input terminal of the comparator 203 or the first terminal of the second resistor R2.

Then, the comparator 203 may compare a voltage of the first input terminal of the comparator 203 with a voltage of the second input terminal of the comparator 203 to output a comparing signal. The counter 204 may output the emulating signal Vcomp1 according to the comparing signal from the comparator 203.

The first sample and hold circuit 21 may sample and hold the valley current of the current sensed signal Isen to output the initial signal Vinit to the initial control circuit 50. Alternatively, the first sample and hold circuit 21 may provide the held valley current of the current sensed signal Isen to the first resistor R1 to charge the third resistor R3, and a voltage of the third resistor R3 being charged as the initial signal Vinit provided to the initial control circuit 50.

Each time when the charging and discharging circuit 31 provides the charging and discharging current to the capacitor Cm according to the emulating signal Vcomp1 to discharge the voltage signal of the capacitor Cm to reach the time point of the valley value of the inductor current IL, the initial control circuit 50 may output the initial current to the capacitor Cm according to the initial signal Vinit from the first sample and hold circuit 21 of the emulation controller circuit 20 or the third resistor R3. As a result, the voltage of the voltage signal of the capacitor Cm is pulled down to the valley voltage by the initial current. Under this condition, the closed-loop inductor current emulating circuit of the embodiment of the present disclosure more smoothly emulates the inductor current IL of the power converter to generate the emulated voltage signal Vemu1.

Figure 3:
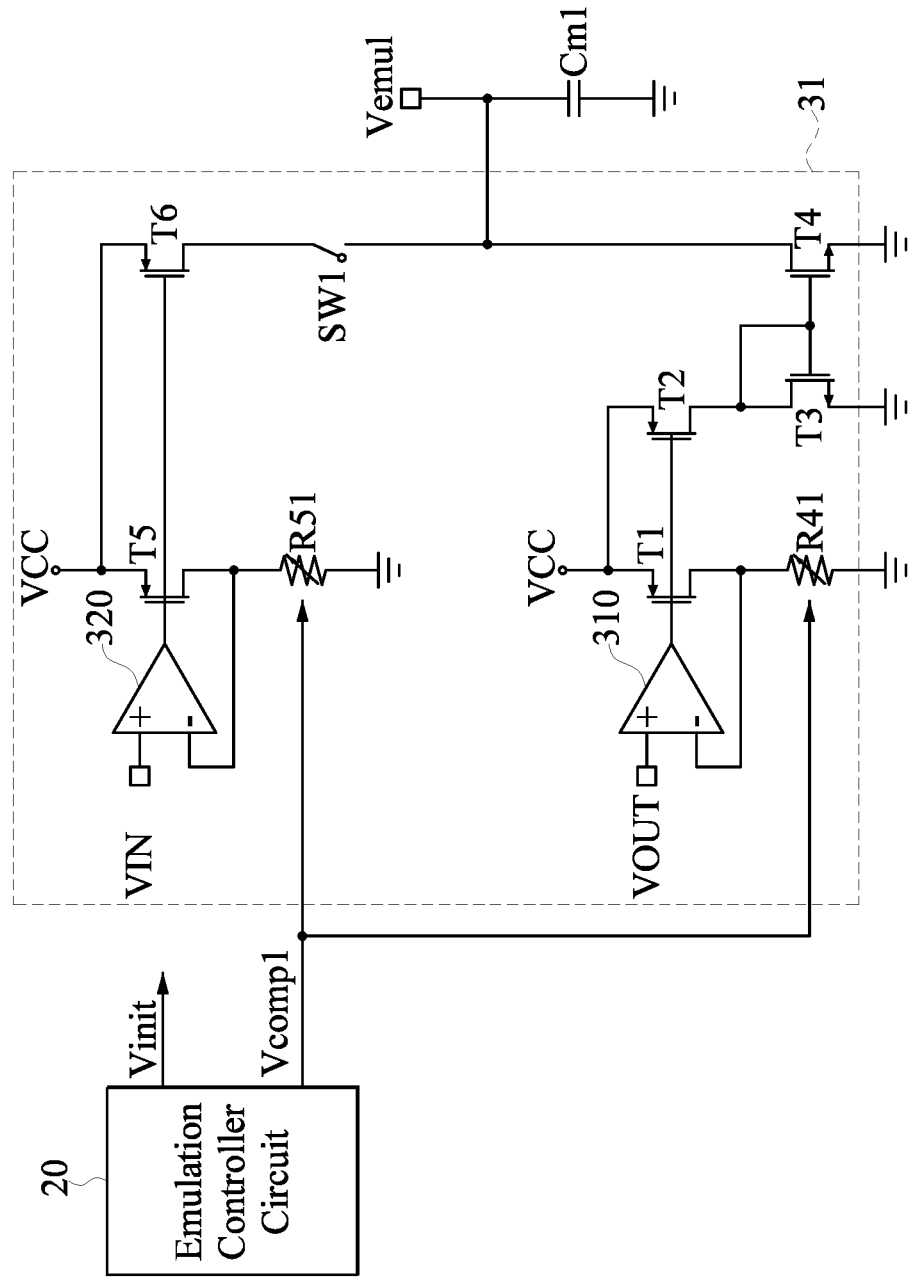
FIG. 3 is a circuit diagram of a charging and discharging circuit of a closed-loop inductor current emulating circuit according to a third embodiment of the present disclosure.

Reference is made to FIG. 3, which is a circuit diagram of a charging and discharging circuit of a closed-loop inductor current emulating circuit according to a third embodiment of the present disclosure.

The closed-loop inductor current emulating circuit of the embodiment of the present disclosure may include the charging and discharging circuit 31 as shown in FIG. 3. The charging and discharging circuit 31 shown in FIGS. 1 and 2 may be the same as that shown in FIG. 3, but the present disclosure is not limited thereto.

As shown in FIG. 3, the charging and discharging circuit 31 may include a first comparator 310, a first charging resistor R41 and a first transistor T1.

A first input terminal such as a non-inverting input terminal of the first comparator 310 of the charging and discharging circuit 31 is connected to the output terminal of the power converter that is the node between the second terminal of the inductor L and the first terminal of the output capacitor Cout. The first input terminal of the first comparator 310 receives the output voltage VOUT of the power converter.

A second input terminal such as an inverting input terminal of the first comparator 310 is connected to a first terminal of the first charging resistor R41. An output terminal of the first comparator 310 is connected to a control terminal of the first transistor T1. A first terminal of the first transistor T1 is coupled to a common voltage VCC. A second terminal of the first transistor T1 is connected to the first terminal of the first charging resistor R41. A second terminal of the first charging resistor R41 is grounded.

It is worth noting that, in the embodiment, the first charging resistor R41 of the charging and discharging circuit 31 is a variable resistor. The emulation controller circuit 20 is connected to a control terminal of the first charging resistor R41. The emulation controller circuit 20 outputs the emulating signal Vcomp1 to the control terminal of the first charging resistor R41. As a result, a resistance of the first charging resistor R41 is adjusted according to a voltage of the emulating signal Vcomp1 so as to adjust a current flowing through the first charging resistor R41 and the first transistor T1.

If necessary, the charging and discharging circuit 31 may further include a second transistor T2. The first transistor T1 and the second transistor T2 form a first current mirror. A current flowing through the first terminal of the first transistor T1 is an input current of the first current mirror. A current flowing through a second terminal of the second transistor T2 is an output current of the first current mirror. A ratio of the input current and the output current of the first charging current mirror MRI is 1:N, wherein N is a positive value. As a result, the current flowing through the first terminal of the first transistor T1 is amplified or reduced by N times to form the current flowing through the second terminal of the second transistor T2.

If necessary, the charging and discharging circuit 31 may further include a third transistor T3 and a fourth transistor T4. The third transistor T3 and the fourth transistor T4 form a second current mirror. A current that flows from a first terminal of the third transistor T3 to a second terminal of the third transistor T3 is equal to the current that flows from the first terminal of the second transistor T2 to the second terminal of the second transistor T2. The current flowing through the first terminal of the third transistor T3 is an input current of the second current mirror. A current that flows from a first terminal of the fourth transistor T4 to a second terminal of the fourth transistor T4 is an output current of the second current mirror. A ratio of the input current and the output current of the second current mirror is 1:M, wherein M is a positive value. As a result, the current that flows from the first terminal of the first transistor T1 to the second terminal of the first transistor T1 is amplified or reduced by N×M times to form the current that flows from the first terminal of the fourth transistor T4 to the second terminal of the fourth transistor T4.

The current that flows from the first terminal of the first transistor T1 to the second terminal of the first transistor T1 (and then is amplified or reduced by N×M times) discharges to the capacitor Cm1. After the capacitor Cm1 is discharged, falling waveform segments of the voltage signal of the capacitor Cm1 are formed. The closed-loop inductor current emulating circuit of the embodiment of the present disclosure emulates the inductor current IL of the inductor L to generate the emulated voltage signal Vemu1 as shown in FIG. 1. Falling waveform segments of the emulated voltage signal Vemu1 are the falling waveform segments of the voltage signal of the capacitor Cm1.

The charging and discharging circuit 31 may further include a charging and discharging circuit 320, a second charging resistor R51 and a fifth transistor T5.

If necessary, a first input terminal such as a non-inverting input terminal of the charging and discharging circuit 320 is coupled to the input voltage VIN. A second input terminal such as an inverting input terminal of the charging and discharging circuit 320 is connected to a first terminal of the second charging resistor R51. A second terminal of the second charging resistor R51 is grounded.

An output terminal of the charging and discharging circuit 320 is connected to a control terminal of the fifth transistor T5. A first terminal of the fifth transistor T5 is coupled to the common voltage VCC. A second terminal of the fifth transistor T5 is connected to the first terminal of the second charging resistor R51.

It is worth noting that, in the embodiment, the second charging resistor R51 of the charging and discharging circuit 31 is a variable resistor. The emulation controller circuit 20 is connected to a control terminal of the second charging resistor R51. The emulation controller circuit 20 outputs the emulating signal Vcomp1 to the control terminal of the second charging resistor R51. A resistance of the second charging resistor R51 is adjusted according to the voltage of the emulating signal Vcomp1 so as to adjust a current flowing through the second charging resistor R51 and the fifth transistor T5.

If necessary, the charging and discharging circuit 31 may further include a sixth transistor T6. The sixth transistor T6 and the fifth transistor T5 form a third current mirror. A current flowing through the first terminal of the fifth transistor T5 is an input current of the third current mirror. A current flowing through a second terminal of the sixth transistor T6 is an output current of the third current mirror. A ratio of the input current and the output current of the third current mirror is 1:P, wherein P is a positive value. As a result, the current flowing from the first terminal of the fifth transistor T5 to the second terminal of the fifth transistor T5 is amplified or reduced by P times to form the current flowing through the second terminal of the sixth transistor T6.

If necessary, the charging and discharging circuit 31 may further include a switch component SW1. A first terminal of the switch component SW1 is connected to the second terminal of the sixth transistor T6. A second terminal of the switch component SW1 is connected to the first terminal of the capacitor Cm1. A control terminal of the switch component SW1 shown in FIG. 3 is connected to the output terminal of the driver circuit 10 shown in FIG. 1 or output terminals of other driver circuits.

The switch component SW1 turns on the switch component SW1 and the high-side switch UG at the same time during an on-time of a high-side conduction signal (at a high level). The current that flows from the first terminal of the fifth transistor T5 to the second terminal of the fifth transistor T5 (and then is amplified or reduced by P times) is provided to the capacitor Cm1 through the switch component SW1 being turned on to charge the capacitor Cm1.

After the capacitor Cm1 is charged, rising waveform segments of the voltage signal of the capacitor Cm1 are formed. The closed-loop inductor current emulating circuit of the embodiment of the present disclosure emulates the inductor current IL of the inductor L to generate the emulated voltage signal Vemu1 as shown in FIG. 1. Rising waveform segments of the emulated voltage signal Vemu1 are the rising waveform segments of the voltage signal of the capacitor Cm1.

Figure 4:
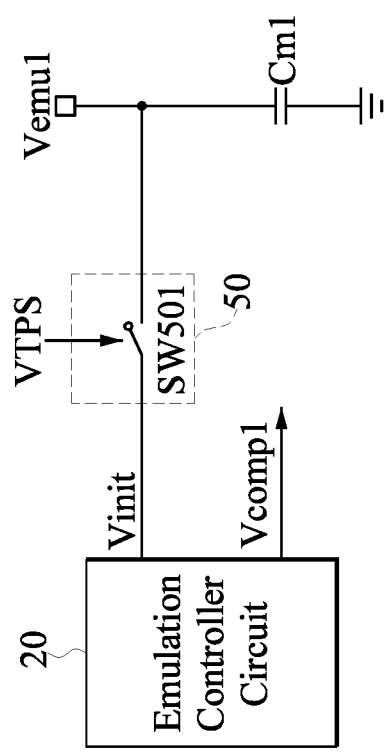
FIG. 4 is a circuit diagram of an initial control circuit of a closed-loop inductor current emulating circuit according to a fourth embodiment of the present disclosure.

Reference is made to FIG. 4, which is a circuit diagram of an initial control circuit of a closed-loop inductor current emulating circuit according to a fourth embodiment of the present disclosure.

The closed-loop inductor current emulating circuit shown in FIG. 1 may include the initial control circuit 50 shown in FIG. 4. A configuration of a circuit component of the initial control circuit 50 shown in FIG. 1 may be the same as that shown in FIG. 4.

As shown in FIG. 4, the initial control circuit 50 may include a switch component SW501. A first terminal of the switch component SW501 is connected to the output terminal of the emulation controller circuit 20. A second terminal of the switch component SW501 is connected to the first terminal of the capacitor Cm1. A control terminal of the switch component SW501 shown in FIG. 4 may be connected to an output terminal of the driver circuit 90 shown in FIG. 1. The control terminal of the switch component SW501 may receive a valley time pulse signal VTPS from the output terminal of the driver circuit 90. Each time when the voltage signal of the capacitor Cm being charged or discharged by the emulation controller circuit 20 reaches the time point of the valley value of the inductor current IL, the switch component SW501 is turned on according to the valley time pulse signal VTPS. As a result, the capacitor Cm1 is pulled down to the valley voltage by the initial signal Vinit through the switch component SW501 being turned on.

Figure 5:
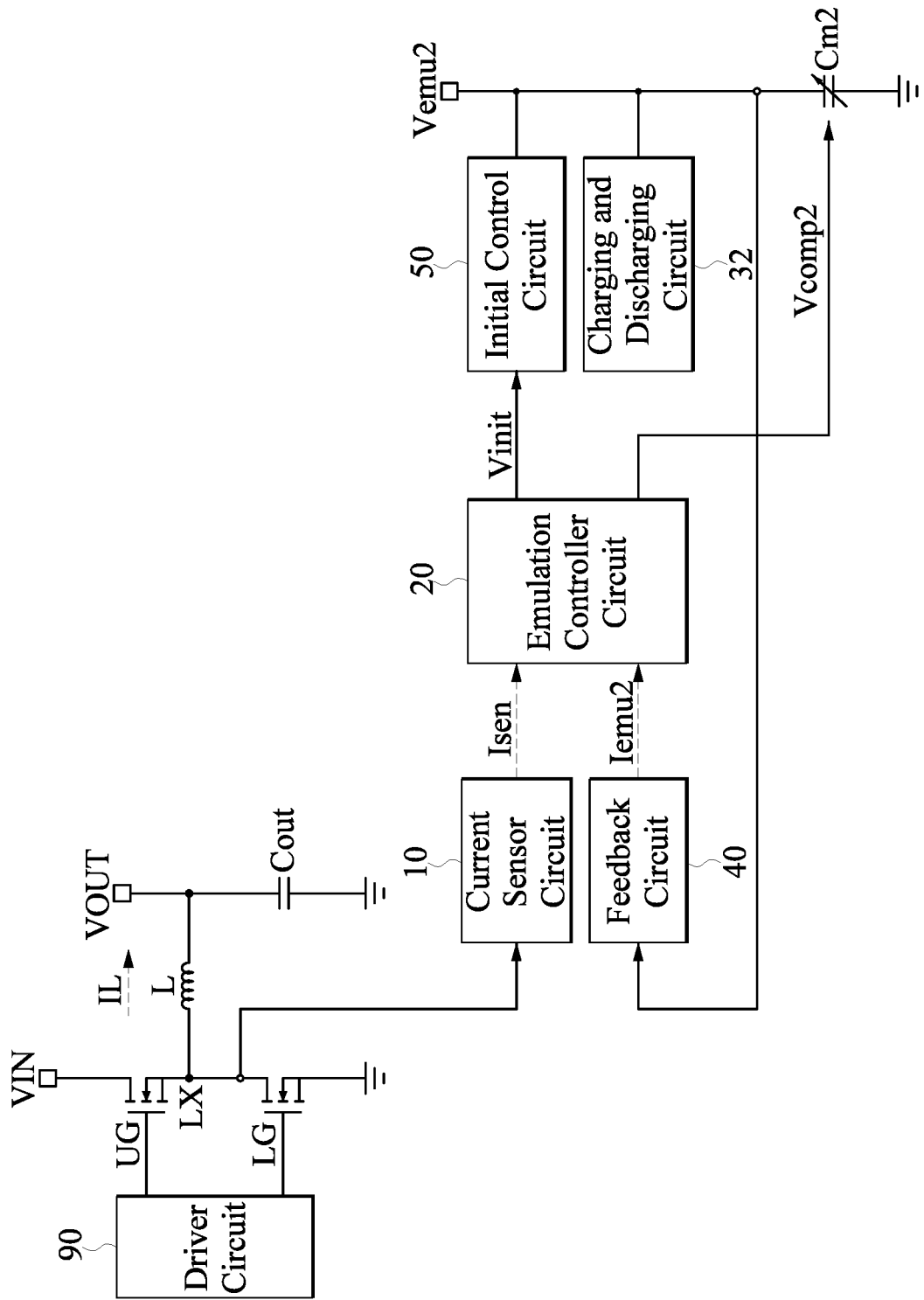
FIG. 5 is a circuit diagram of a closed-loop inductor current emulating circuit according to a fifth embodiment of the present disclosure.

Reference is made to FIG. 5, which is a circuit diagram of a closed-loop inductor current emulating circuit according to a fifth embodiment of the present disclosure. The same descriptions of the first and fifth embodiments are not repeated herein.

A difference between the first and fifth embodiments is that, the capacitor Cm1 of the first embodiment is a fixed capacitor as shown in FIG. 1, but a capacitor Cm2 of the fifth embodiment is a variable capacitor as shown in FIG. 5. In the fifth embodiment, a control terminal of the capacitor Cm2 is connected to the emulation controller circuit 20 as shown in FIG. 5, and a capacitance of the capacitor Cm2 is adjusted by the emulation controller circuit 20.

As shown in FIG. 5, in the fifth embodiment, the emulation controller circuit 20 outputs an emulating signal Vcomp2 to the control terminal of the capacitor Cm2 according to the current sensed signal Isen from the current sensor circuit 10. The capacitance of the capacitor Cm2 is adjusted according to a voltage of the emulating signal Vcomp2.

In the fifth embodiment, a charging and discharging circuit 32, according to the input voltage VIN of the first terminal of the high-side switch UG of the power converter, the output voltage VOUT of the power converter (that is a voltage of the node between the second terminal of the inductor L and the first terminal of the output capacitor Cout) or a combination thereof instead of the emulating signal Vcomp2, output the charging and discharging current to a first terminal of the capacitor Cm2 to charge the capacitor Cm2.

The feedback circuit 40 may output a feedback signal Iemu2 to the emulation controller circuit 20 according to a voltage signal or a current signal of the capacitor Cm2 For example, the feedback circuit 40 obtains the voltage signal of the capacitor Cm2 and converts the voltage signal of the capacitor Cm2 into the current signal, and then provides the current signal to the emulation controller circuit 20, but the present disclosure is not limited thereto.

The emulation controller circuit 20 may compensate the emulating signal Vcomp2 according to the feedback signal Iemu2 from the feedback circuit 40. The emulation controller circuit 20 may output the emulating signal Vcomp2 that is compensated to the control terminal of the capacitor Cm2 The capacitance of the capacitor Cm2 is adjusted according to the voltage of the emulating signal Vcomp2 that is compensated.

That is, the emulation controller circuit 20 may adjust the capacitance of the capacitor Cm2 according to the current sensed signal Isen from the current sensor circuit 10, the feedback signal Iemu2 from the feedback circuit 40 or a combination thereof.

Figure 6:
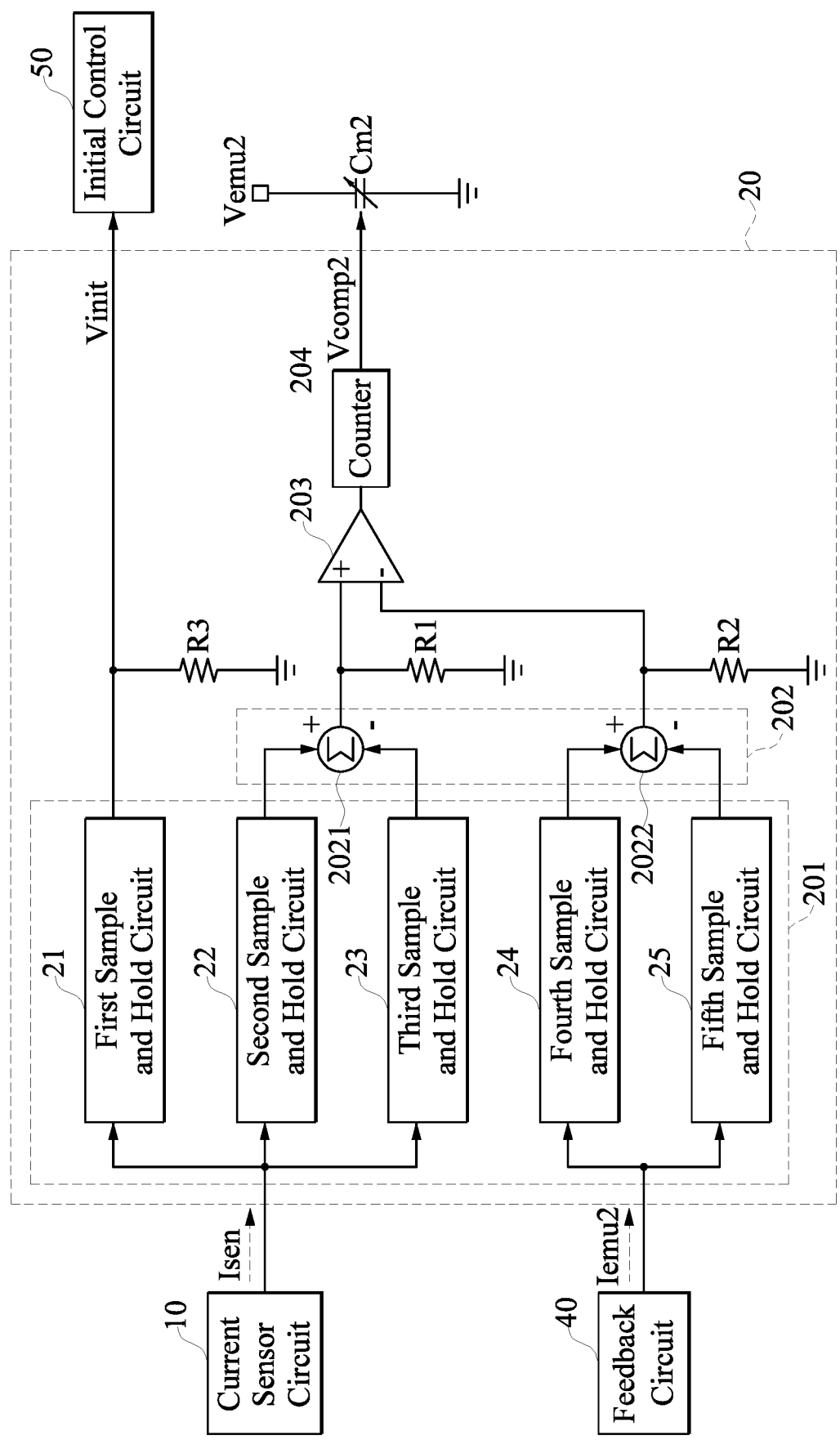
FIG. 6 is a circuit diagram of an emulation controller circuit of a closed-loop inductor current emulating circuit according to a sixth embodiment of the present disclosure.

Reference is made to FIG. 6, which is a circuit diagram of an emulation controller circuit of a closed-loop inductor current emulating circuit according to a sixth embodiment of the present disclosure. The same descriptions of the second and sixth embodiments of the present disclosure are not repeated herein.

The emulation controller circuit 20 shown in FIG. 6 may be the same as that shown in FIG. 2, but the present disclosure is not limited thereto. Configurations of circuit components of the emulation controller circuit 20 shown in FIG. 5 may be the same as that shown in FIG. 6.

A difference between the sixth embodiment of FIG. 6 and the second embodiment of FIG. 2 is that, the output terminal of the counter 204 of the emulation controller circuit 20 is connected to the input terminal of the charging and discharging circuit 30 as shown in FIG. 2, but the output terminal of the counter 204 of the emulation controller circuit 20 is connected to the input terminal of the control terminal of the capacitor Cm2 as shown in FIG. 6. In the sixth embodiment, the capacitance of the capacitor Cm2 is adjusted according to the voltage of the emulating signal Vcomp2 from the counter 204 of the emulation controller circuit 20.

Figure 7:
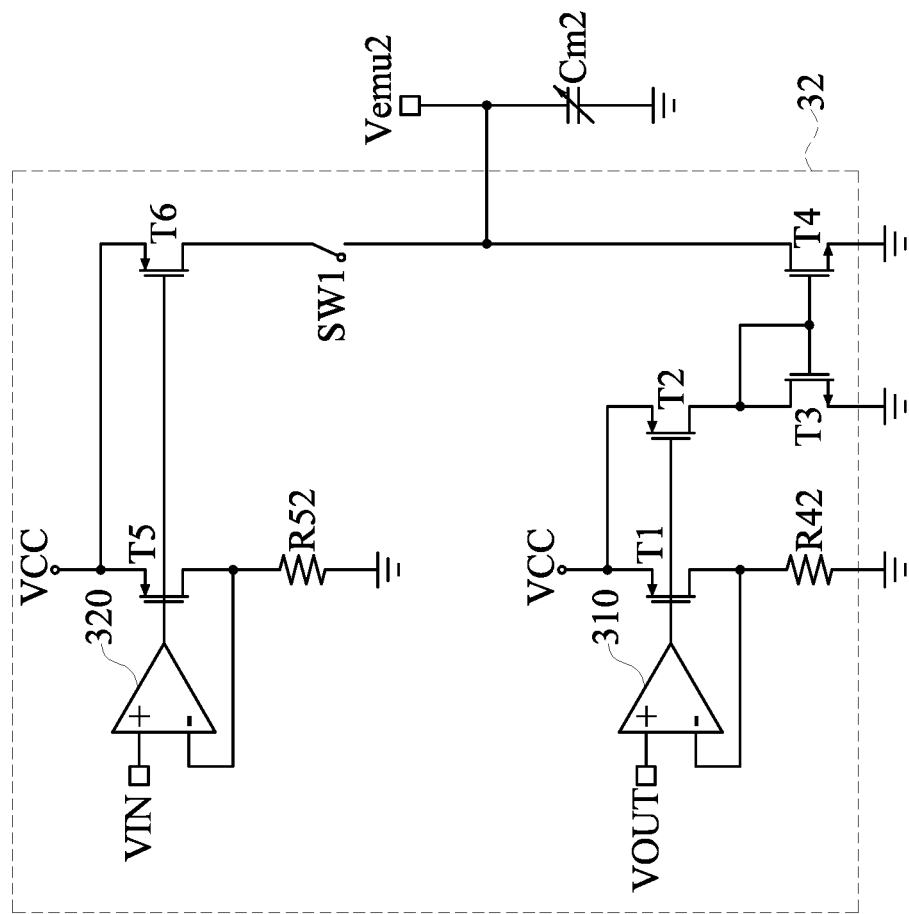
FIG. 7 is a circuit diagram of a charging and discharging circuit of a closed-loop inductor current emulating circuit according to a seventh embodiment of the present disclosure.

Reference is made to FIG. 7, which is a circuit diagram of a charging and discharging circuit of a closed-loop inductor current emulating circuit according to a seventh embodiment of the present disclosure.

The charging and discharging circuit 32 shown in FIG. 7 may be the same as that shown in FIG. 3, but the present disclosure is not limited thereto. Configurations of circuit components of the charging and discharging circuit 32 shown in FIG. 5 may be the same as that shown in FIG. 7. The same descriptions of the third and seventh embodiments of the present disclosure are not repeated herein.

Differences between the seventh embodiment of FIG. 7 and the third embodiment of FIG. 3 are described in the following.

As shown in FIG. 3, in the third embodiment, the first charging resistor R41 and the second charging resistor R51 are the variable resistors. The resistances of the first charging resistor R41 and the second charging resistor R51 are adjusted according the voltage of the emulating signal Vcomp1. However, as shown in FIG. 7, in the seventh embodiment, a first charging resistor R42 and a second charging resistor R52 are fixed resistors. Resistances of the first charging resistor R42 and the second charging resistor R52 are constant values and are not changed according the voltage of the emulating signal Vcomp2.

In addition, as shown in FIG. 3, in the third embodiment, the second terminal of the switch component SW1 and the first terminal of the fourth transistor T4 in the charging and discharging circuit 31 are connected to the first terminal of the capacitor Cm1 that is the fixed capacitor. However, as shown in FIG. 7, in the seventh embodiment, the second terminal of the switch component SW1 of the charging and discharging circuit 32 and the first terminal of the fourth transistor T4 are connected to the first terminal of the capacitor Cm2 that is the variable capacitor.

Figure 8:
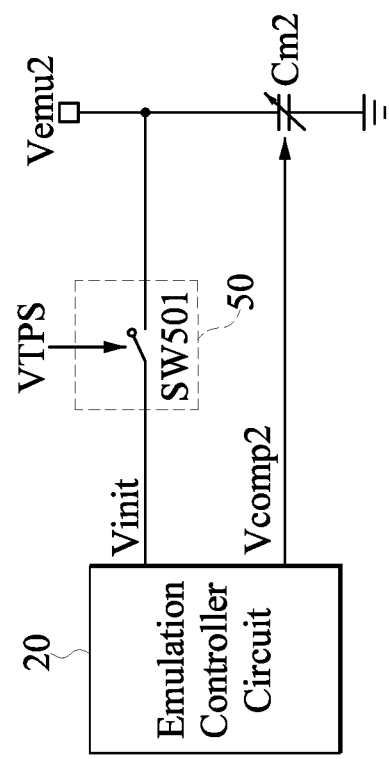
FIG. 8 is a circuit diagram of an initial control circuit of a closed-loop inductor current emulating circuit according to an eighth embodiment of the present disclosure.

Reference is made to FIG. 8, which is a circuit diagram of an initial control circuit of a closed-loop inductor current emulating circuit according to an eighth embodiment of the present disclosure. The same descriptions of the fourth and eighth embodiments are not repeated herein.

A difference between the fourth embodiment of FIG. 4 and eighth embodiment of FIG. 8 is described as follows. As shown in FIG. 4, in the fourth embodiment, the second terminal of the switch component SW501 is connected to the first terminal of the capacitor Cm1 that is the fixed capacitor, and the emulation controller circuit 20 is not connected to the capacitor Cm1. However, as shown in FIG. 8, in the eighth embodiment, the second terminal of the switch component SW501 is connected to the first terminal of the capacitor Cm2, and the emulation controller circuit 20 is connected to the control terminal of the capacitor Cm2 that is the variable capacitor to adjust the capacitance of the capacitor Cm2.

In conclusion, the present disclosure provides the closed-loop inductor current emulating circuit. The configurations of the closed-loop inductor current emulating circuit are different from that of a conventional inductor current emulating circuit. The closed-loop inductor current emulating circuit of the present disclosure detects the currents of the rising waveform segments and the falling waveform segments of the plurality of waveforms of the current sensed signal of the low-side switch of the power converter. The closed-loop inductor current emulating circuit of the present disclosure is able to accurately and quickly emulate complete information of the inductor current according to the detected currents.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A closed-loop inductor current emulating circuit, which is applicable to a power converter, wherein the power converter includes a driver circuit, a high-side switch, a low-side switch, an inductor and an output capacitor, an output terminal of the driver circuit is connected to a control terminal of the high-side switch and a control terminal of the low-side switch, a first terminal of the high-side switch is coupled to an input voltage, a second terminal of the high-side switch is connected to a first terminal of the low-side switch, a second terminal of the low-side switch is grounded, a node between the second terminal of the high-side switch and the first terminal of the low-side switch is connected to a first terminal of the inductor, a second terminal of the inductor is connected to a first terminal of the output capacitor, and a second terminal of the output capacitor is grounded, the closed-loop inductor current emulating circuit comprising:
   a current sensor circuit connected to the first terminal of the low-side switch and configured to sense a current flowing through the first terminal of the low-side switch to output a current sensed signal;
   an emulation controller circuit connected to the current sensor circuit, configured to determine a plurality of voltages of a plurality of waveforms of an emulating signal according to a plurality of currents of the current sensed signal, and configured to output the emulating signal;
   a feedback circuit connected to a first terminal of a capacitor and the emulation controller circuit, wherein a second terminal of the capacitor is grounded, the feedback circuit is configured to output a feedback signal to the emulation controller circuit according to a voltage signal or a current signal of the capacitor, the emulation controller circuit is configured to compensate the emulating signal according to the feedback signal, and The emulation controller circuit is configured to output the emulating signal that is compensated; and
   a charging and discharging circuit connected to the first terminal of the capacitor;
   wherein, when the emulation controller circuit outputs the emulating signal to the charging and discharging circuit being connected to the emulation controller circuit, the charging and discharging circuit outputs a charging and discharging current to the first terminal of the capacitor according to the emulating signal;
   wherein, when the emulation controller circuit outputs the emulating signal to a control terminal of the capacitor being connected to the emulation controller circuit to adjust a capacitance of the capacitor, the charging and discharging circuit outputs the charging and discharging current to the first terminal of the capacitor according to the input voltage, a voltage of a node between the second terminal of the inductor and the first terminal of the output capacitor or a combination thereof.

2. The closed-loop inductor current emulating circuit according to claim 1, wherein the feedback circuit obtains the voltage signal of the capacitor and then converts the voltage signal of the capacitor into the current signal as the feedback signal.

3. The closed-loop inductor current emulating circuit according to claim 1, wherein the emulation controller circuit includes a sample and hold circuit configured to sample and hold the plurality of currents on a plurality of waveform segments of a plurality of waveforms of the current sensed signal and the feedback signal.

4. The closed-loop inductor current emulating circuit according to claim 3, wherein the plurality of currents being sampled and held by the sample and hold circuit include valley currents on one or more of the plurality of waveforms of one or both of the current sensed signal and the feedback signal.

5. The closed-loop inductor current emulating circuit according to claim 3, wherein the plurality of currents being sampled and held by the sample and hold circuit include currents of one or both of the current sensed signal and the feedback signal that are generated when a current time reaches half of an on-time of the low-side switch.

6. The closed-loop inductor current emulating circuit according to claim 3, wherein the emulation controller circuit further includes an arithmetic circuit connected to the sample and hold circuit, the arithmetic circuit calculates a current difference between the plurality of currents at different time points on each of the plurality of waveform segments of the current sensed signal, and the arithmetic circuit calculates a current difference between the plurality of currents at different time points on each of the plurality of waveform segments of the feedback signal.

7. The closed-loop inductor current emulating circuit according to claim 6, wherein the emulation controller circuit further includes a first resistor and a second resistor, a first terminal of the first resistor and a first terminal of the second resistor are connected to the arithmetic circuit and the charging and discharging circuit, a second terminal of the first resistor and a second terminal of the second resistor are grounded, the arithmetic circuit provides the current difference between the plurality of currents on each of the plurality of waveform segments of the current sensed signal to the first resistor, the arithmetic circuit provides the current difference between the plurality of currents on each of the plurality of waveform segments of the feedback signal to the second resistor, and a voltage of the emulating signal depends on a voltage of the first resistor, a voltage of the second resistor or a combination thereof.

8. The closed-loop inductor current emulating circuit according to claim 7, wherein the emulation controller circuit further includes a comparing circuit connected to the first terminal of the first resistor and the first terminal of the second resistor, the comparing circuit is configured to compare a voltage of the first terminal of the first resistor with a voltage of the first terminal of the second resistor to output a comparing signal, and the voltage of the emulating signal depends on the comparing signal.

9. The closed-loop inductor current emulating circuit according to claim 8, wherein the emulation controller circuit further includes a counter connected to the comparing circuit, and the counter is configured to count the comparing signal to output the emulating signal.

10. The closed-loop inductor current emulating circuit according to claim 9, wherein the emulation controller circuit further includes a third resistor, a first terminal of the third resistor is connected to the sample and hold circuit, a second terminal of the third resistor is grounded, the third resistor receives an initial current of each of the plurality of waveforms of the current sensed signal that is sampled and held by the sample and hold circuit, and a voltage of the third resistor is provided to the capacitor.

11. The closed-loop inductor current emulating circuit according to claim 10, further comprising:
an initial control circuit connected to the emulation controller circuit and the first terminal of the capacitor, the emulation controller circuit outputs an initial signal according to a valley current of the sensed current signal or a voltage of the third resistor being charged by the initial current, and the initial control circuit outputs the initial current to the capacitor to pull down a voltage of the voltage signal of the capacitor to a valley voltage according to the initial signal.

12. The closed-loop inductor current emulating circuit according to claim 11, wherein the initial control circuit includes a switch component, a first terminal of the switch component is connected to the emulation controller circuit, a second terminal of the switch component is connected to the first terminal of the capacitor, a control terminal of the switch component is coupled to a valley time pulse signal, and the switch component is turned on or off according to a level of the valley time pulse signal.

13. The closed-loop inductor current emulating circuit according to claim 1, wherein the charging and discharging circuit includes a first comparator, a first charging resistor and a first transistor, a first input terminal of the first comparator is connected to the node between the second terminal of the inductor and the first terminal of the output capacitor, a second input terminal of the first comparator is connected to a first terminal of the first charging resistor, a second terminal of the first charging resistor is grounded, an output terminal of the first comparator is connected to a control terminal of the first transistor, a first terminal of the first transistor is coupled to a common voltage, a second terminal of the first transistor is connected to the first terminal of the first charging resistor, and the first terminal of the capacitor is connected to the first terminal of the first transistor.

14. The closed-loop inductor current emulating circuit according to claim 13, wherein the emulation controller circuit is connected to a control terminal of the first charging resistor, and the emulation controller circuit outputs the emulating signal to the control terminal of the first charging resistor to adjust a resistance of the first charging resistor.

15. The closed-loop inductor current emulating circuit according to claim 13, wherein the charging and discharging circuit further includes a second transistor, a control terminal of the second transistor is connected to the output terminal of the first comparator, a first terminal of the second transistor is coupled to the common voltage, and a second terminal of the second transistor is connected to the first terminal of the capacitor.

16. The closed-loop inductor current emulating circuit according to claim 15, wherein the charging and discharging circuit further includes a third transistor and a fourth transistor, a first terminal and a control terminal of the third transistor are connected to the second terminal of the second transistor and a control terminal of the fourth transistor, a first terminal of the fourth transistor is connected to the first terminal of the capacitor, and a second terminal of the third transistor and a second terminal of the fourth transistor are grounded.

17. The closed-loop inductor current emulating circuit according to claim 16, wherein the charging and discharging circuit further includes a second comparator, a second charging resistor and a fifth transistor, a first input terminal of the second comparator is coupled to the input voltage, a second input terminal of the second comparator is connected to a first terminal of the second charging resistor, a second terminal of the second charging resistor is grounded, the output terminal of the first comparator is connected to a control terminal of the fifth transistor, a first terminal of the fifth transistor is coupled to the common voltage, a second terminal of the fifth transistor is connected to the first terminal of the second charging resistor, and the first terminal of the capacitor is connected to the first terminal of the fifth transistor.

18. The closed-loop inductor current emulating circuit according to claim 17, wherein the emulation controller circuit is connected to a control terminal of the second charging resistor, and the emulation controller circuit outputs the emulating signal to the control terminal of the second charging resistor to adjust a resistance of the second charging resistor.

19. The closed-loop inductor current emulating circuit according to claim 18, wherein the charging and discharging circuit further includes a sixth transistor, a control terminal of the sixth transistor is connected to an output terminal of the second comparator, a first terminal of the sixth transistor is coupled to the common voltage, and a second terminal of the sixth transistor is connected to the first terminal of the capacitor.

20. The closed-loop inductor current emulating circuit according to claim 19, wherein the charging and discharging circuit further includes a switch component, a first terminal of the switch component is connected to the second terminal of the sixth transistor, a second terminal of the switch component is connected to the first terminal of the capacitor, a control terminal of the switch component is connected to the driver circuit, the control terminal of the switch component receives a high-side conduction signal for controlling the high-side switch to operate from the driver circuit, and the high-side switch and the switch component are turned on during an on-time of the high-side conduction signal.

\* \* \* \* \*